United States Patent
Hwang et al.

(10) Patent No.: US 9,472,938 B2
(45) Date of Patent: Oct. 18, 2016

(54) BUSBAR COUPLING DEVICE ASSEMBLY

(71) Applicant: LSIS CO., LTD., Anyang-si, Gyeonggi-do (KR)

(72) Inventors: Hyun Si Hwang, Anyang-si (KR); Sung Jun Oh, Cheonan-si (KR); Ki Young Moon, Cheonan-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/550,758

(22) Filed: Nov. 21, 2014

(65) Prior Publication Data
US 2015/0155692 A1   Jun. 4, 2015

(30) Foreign Application Priority Data
Dec. 3, 2013 (KR) .................. 20-2013-0009986 U

(51) Int. Cl.
*H01R 3/00* (2006.01)
*H02G 5/02* (2006.01)
*H05K 7/14* (2006.01)

(52) U.S. Cl.
CPC ............ *H02G 5/025* (2013.01); *H05K 7/1432* (2013.01)

(58) Field of Classification Search
CPC ...... H01R 13/595; H01R 3/00; H02G 5/025; H01B 17/18; H02B 13/045; H02B 13/065
USPC ............................................ 174/70; 439/110
See application file for complete search history.

(56) References Cited

U.S. PATENT DOCUMENTS

| | | | | |
|---|---|---|---|---|
| 2006/0098693 | A1* | 5/2006 | Goertz | H01P 1/2138 370/534 |
| 2007/0212904 | A1* | 9/2007 | Buttner | H01R 9/2608 439/76.2 |
| 2010/0200264 | A1* | 8/2010 | Maegawa | B29C 45/0046 174/68.2 |
| 2012/0129392 | A1* | 5/2012 | Fujisaki | H01R 13/521 439/587 |
| 2013/0306369 | A1* | 11/2013 | Li | H02G 5/00 174/71 B |
| 2014/0004727 | A1* | 1/2014 | Jimbo | H01R 9/226 439/110 |
| 2015/0115423 | A1* | 4/2015 | Yamashita | H01L 23/49575 257/675 |

* cited by examiner

*Primary Examiner* — Hoa C Nguyen
*Assistant Examiner* — Stanley Tso
(74) *Attorney, Agent, or Firm* — Lee, Hong, Degerman, Kang & Waimey; Jonathan Kang; Richard Salfelder

(57) ABSTRACT

Provided is a busbar coupling device. The busbar coupling device includes: a plate including a first side and a second side disposed opposite to each other; a first end wall part protruding and extending in a direction that the first side faces at a first end part in a length direction of the plate; a first protrusion part disposed at the plate, spaced from the first end wall part, and protruding in the direction that the first side faces; a second end wall part protruding and extending from a second end part disposed opposite to the first end part to a direction that the second side faces in the length direction of the plate; and a second protrusion part disposed at the plate, spaced from the first end wall part, and protruding in the direction that the first side faces.

7 Claims, 4 Drawing Sheets

- Prior Art -

# BUSBAR COUPLING DEVICE ASSEMBLY

CROSS-REFERENCE TO RELATED APPLICATIONS

Pursuant to 35 U.S.C. §119(a), this application claims the benefit of earlier filing date and right of priority to Korean Patent Application No. 20-2013-0009986, filed on Dec. 3, 2013, the contents of which are hereby incorporated by reference herein in its entirety.

BACKGROUND

The present invention disclosure relates to a busbar coupling device, and particularly, to a busbar coupling device assembly easily coupling two busbars and insulating them from each other.

Recently, busbars are equipped inside various kinds of electronic devices. A busbar refers to a conductor commonly connecting between a plurality of circuits and has a plate-shaped conductor formed of copper or aluminum without an insulating clad.

A plurality of such busbars are used at the same time frequently. That is, a plurality of busbars are disposed inside any one electronic device.

At this point, since a busbar has a plate-shaped portion with a relatively large area typically, when a plurality of busbars are installed in one electronic device, a structure in which plate-shaped portions overlap each other and are stacked is efficient in terms of space utilization.

However, the plurality of busbars need to be insulated from each other. Accordingly, when several busbars are stacked and installed in a narrow space, how to insulate them from each other becomes an issue.

In order to insulate busbars from each other, a method of broadening an interval between busbars and arranging them is used in general. However, this is inefficient in terms of space utilization.

As another typical method, suggested is a method of inserting an insulating paper.

FIG. 1 is a view illustrating a portion of an inverter used in a typical electric vehicle.

A typical insulating structure insulating two busbars from each other by inserting an insulating paper 31 is described with reference to FIG. 1.

Referring to FIG. 1, a first busbar 21 and a second busbar 22 are located at the outside of a housing 11 of the inverter. The first busbar 21 is fixed at the upper part of the housing 11 by bolts and the second busbar 22 is fixed at the upper part of the first busbar 21 by bolts.

At this point, the insulating paper 31 is disposed between the first busbar 21 and the second busbar 22. The insulating paper 31 is a thin member formed of an insulating material.

When the insulating paper 31 is disposed between the first busbar 21 and the second busbar 22, if not fixed, it may be slipped and may then become out of its position.

Especially, if the insulating paper 31 is installed at a device with many vibrations, for example, an inverter for electric vehicle, such a phenomenon is likely to happen more and when the insulating paper 31 is out of its position, an insulating state is released between adjacent two busbars 21 and 22 and thus an electric current flows therebetween.

Therefore, when the insulating paper 31 is used, the position of the insulating paper 31 needs to be fixed by a bolt separately.

That is, after the first busbar 21 is fixed and the insulating paper 31 is laid, an additional coupling process for fixing the insulating paper 31 is performed and then, the second busbar 22 is installed on the insulating paper 31 and fixed.

Accordingly, the manufacturing processes of an electronic device become complex and also when an insulating paper is installed at an electric vehicle with frequent vibrations, its durability may be vulnerable.

SUMMARY

Embodiments provide a busbar coupling device assembly for the reduction in the manufacturing costs of an electronic device including a plurality of busbars and the improvement of durability while coupling the plurality of busbars and insulating them from each other.

In one embodiment, a busbar coupling device includes: a plate including a first side and a second side disposed opposite to each other; a first end wall part protruding and extending in a direction that the first side faces at a first end part in a length direction of the plate; a first protrusion part disposed at the plate, spaced from the first end wall part, and protruding in the direction that the first side faces; a second end wall part protruding and extending from a second end part disposed opposite to the first end part to a direction that the second side faces in the length direction of the plate; and a second protrusion part disposed at the plate, spaced from the first end wall part, and protruding in the direction that the first side faces.

In another embodiment, a busbar coupling device assembly includes a busbar coupling device to which a plurality of busbars are coupled at both sides, and a first bus bar and a second bus bar coupled to the busbar coupling device, wherein the busbar coupling device includes: a plate including a first side and a second side disposed opposite to each other; a first end wall part protruding and extending in a direction that the first side faces at a first end part in a length direction of the plate; a first protrusion part disposed at the plate, spaced from the first end wall part, and protruding in the direction that the first side faces; a second end wall part protruding and extending from a second end part disposed opposite to the first end part to a direction that the second side faces in the length direction of the plate; and a second protrusion part disposed at the plate, spaced from the first end wall part, and protruding in the direction that the first side faces, wherein the first busbar and the second bus bar are coupled to the first side and the second side, respectively; the first busbar is forcibly inserted between the first end wall part and the first protrusion part; and the second busbar is forcibly inserted between the second end wall part and the second protrusion part.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
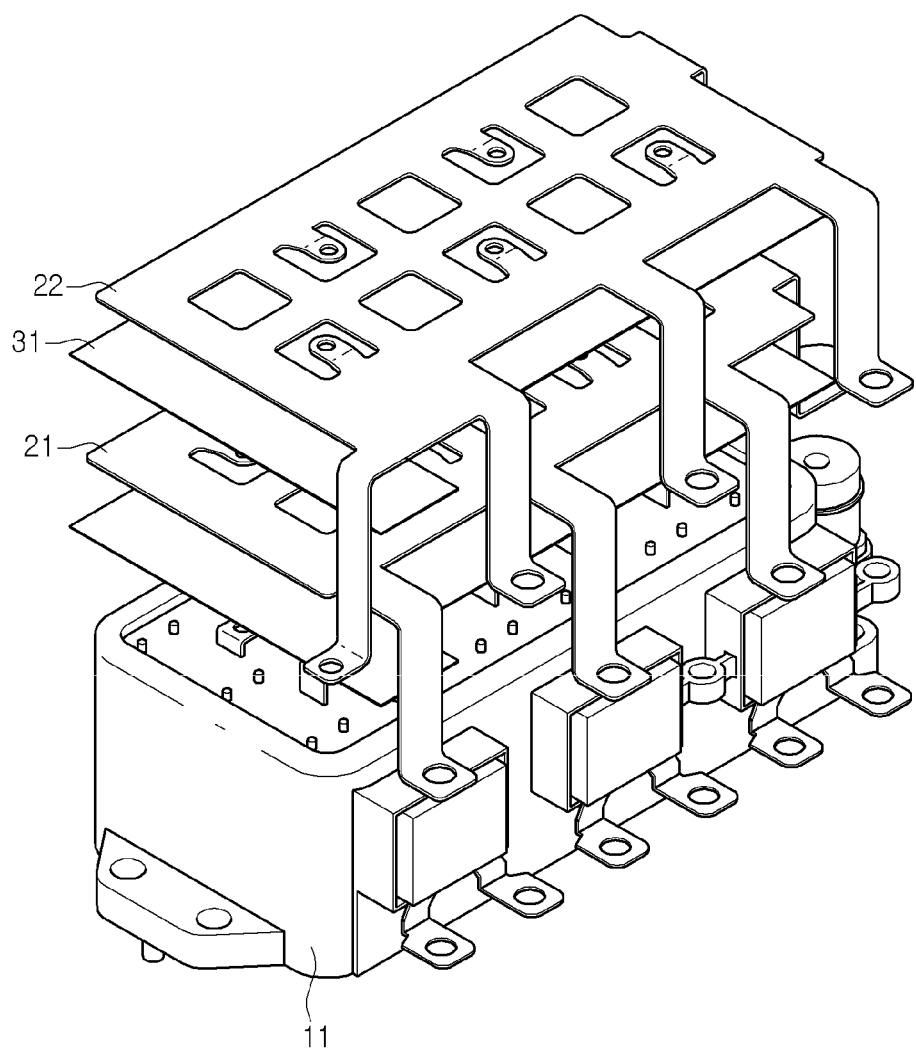
FIG. 1 is an exploded perspective view illustrating a portion of an electronic device including a plurality of typical busbars.
Figure 2:
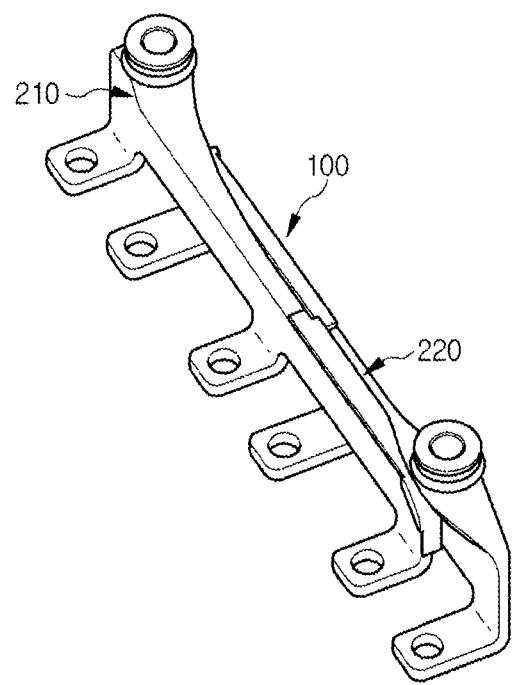
FIG. 2 is a perspective view illustrating the assembly of a busbar coupling device according to an embodiment of the present invention.
Figure 3:
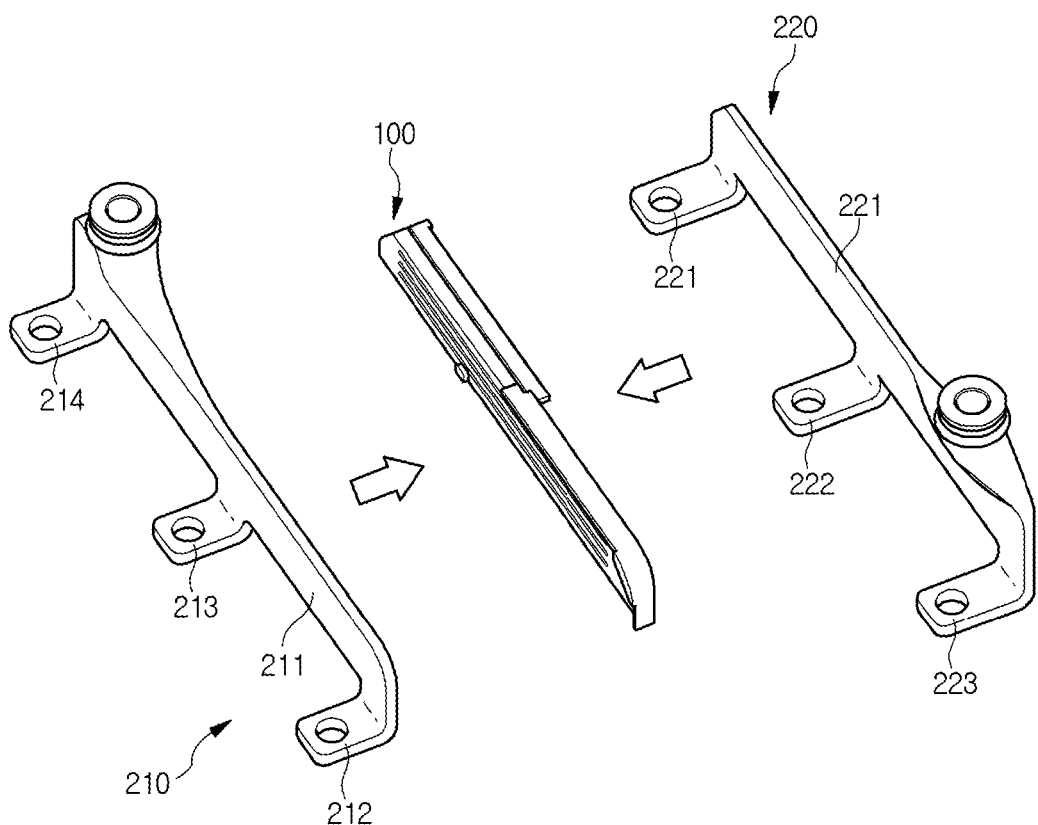
FIG. 3 is an exploded perspective view illustrating the assembly of a busbar coupling device according to an embodiment of the present invention.

FIG. 2 is a perspective view illustrating a busbar coupling device assembly according to an embodiment of the present invention. FIG. 3 is an exploded perspective view of a busbar coupling device assembly according to an embodiment of the present invention.

A plurality of busbars 210 and 220 are coupled to a busbar coupling device 100.

Figure 4:
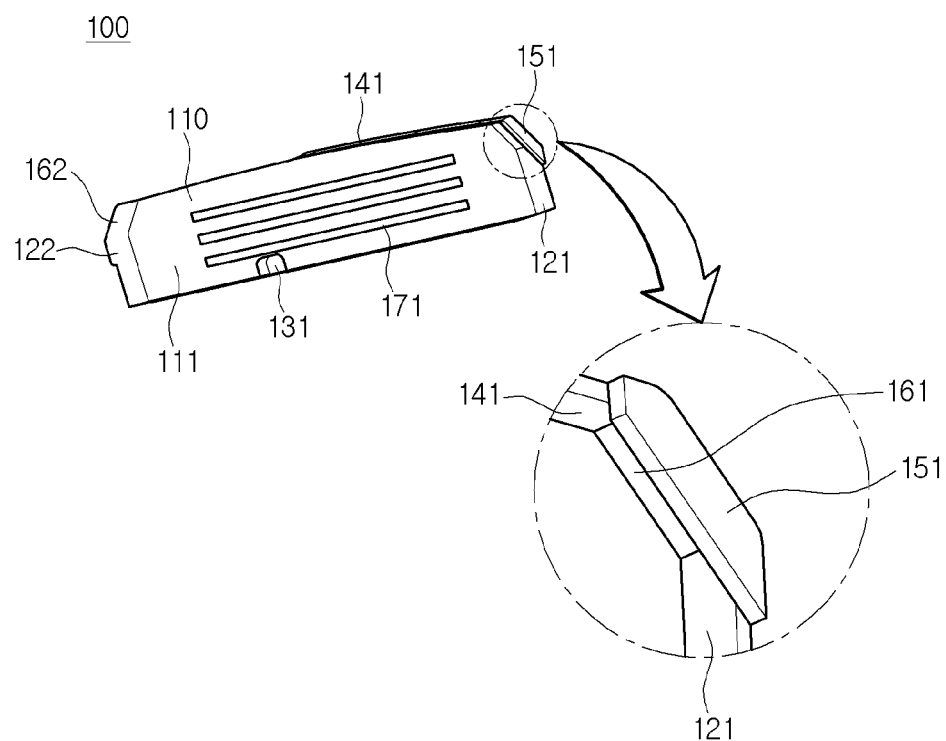
FIG. 4 is a perspective view illustrating a busbar coupling device according to an embodiment of the present invention.

FIG. 4 is a perspective view of the busbar coupling device 100.

Referring to FIG. 4, the busbar coupling device 100 includes a plate 110. The plate 110 has a thin plate form and extends longer in a left and right length direction than a top and bottom direction.

The plate 110 includes a first side 111 and a second side 112 opposite to the first side 111. Therefore, the direction that the first side 111 faces is opposite to the direction the second side 112 faces.

The first side 111 is equipped with a reinforcing rib 171 extending long in a left and right length direction. A plurality of reinforcing ribs 171 may be disposed vertically. Additionally, a reinforcing rib extending long in a left and right length direction may be equipped at the second side 112 with the same form as the first side 111.

The plate 110 includes a first end part (the right end part in FIG. 4) that is an end part at one side of a length direction and a second end part (the left end part in FIG. 4) that is an end part at the other side in the length direction. Accordingly, the first end part and the second end part may be disposed opposite to each other in the length direction of the plate 110.

The busbar coupling device 100 includes a first end wall part 121 protruding from the first end part (the right end part in FIG. 4) toward a direction that the first side 111 faces. The first end wall part 121 extends long vertically at the first end part.

Additionally, the busbar coupling device 100 includes a first upper wall part 141 extending in a left and right direction along an upper end of the plate 110 near the first end part. The first upper wall part 141 protrudes and extends toward the direction that the first side 111 faces like the first end wall part 121.

The busbar coupling device 100 may further include a first edge wall part 161.

The first edge wall part 161 protrudes in the direction that the first side 111 faces and is disposed at the edge of the first side 111 of the plate 110. The first edge wall part 161 has one end toward the first end wall part 121 and the other end extending toward a first upper wall part 131. In more detail, the one end of the first edge wall part 161 contacts the first end wall part 121, and the other end contacts the first upper wall part 132 and extends to be inclined toward the outside of a left and right direction as it approaches from the top to the bottom.

The busbar coupling device 100 may further include a first cover wall part 151.

The first cover wall part 151 extends spaced toward the front of the plate 110. That is, the first cover wall part 151 is spaced a predetermined distance from the first side 111 of the plate 110 in the direction that the first side 111 faces. The first cover wall part 151 may be coupled to the front ends of the first end wall part 121, the first upper wall part 141, and the first edge wall part 161.

An edge part of the first busbar 210 described later is inserted into a separated space between the plate 110 and the first cover wall part 151.

The busbar coupling device 100 may further include a first protrusion 131.

The first protrusion 131 protrudes from the first side 111 of the plate 110 in the direction that the first side 111 faces and is spaced a predetermined distance from the first end part toward the second end part. The first protrusion 131 is disposed near a lower end of the first side 111.

The first protrusion 131 is disposed closer to the second end part (the left in FIG. 4) from the center of the left and right direction.

Moreover, components equipped at the first side 111 are equipped to be symmetric at the second side 112 of the plate 110.

Figure 5:
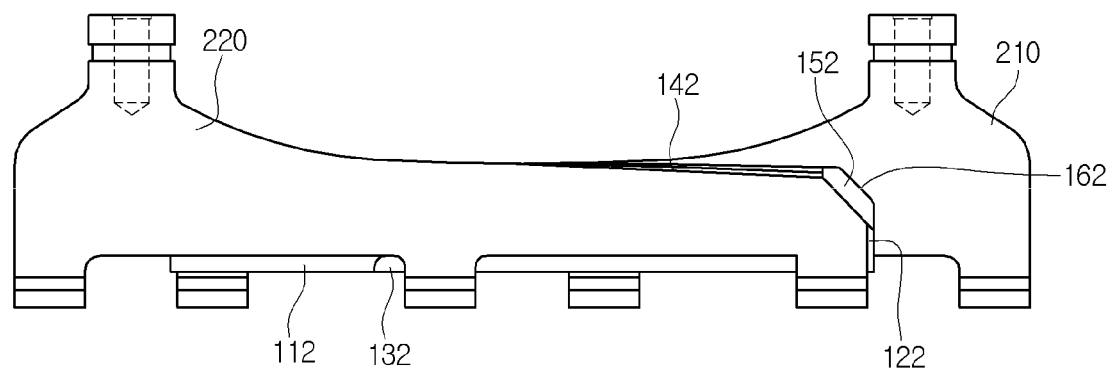
FIG. 5 is a view illustrating the assembly rear of a busbar coupling device according to an embodiment of the present invention.

Referring to FIG. 5, the plate 110 includes a second end wall part 122 protruding at the second end part in the direction that the second side 112 faces. The second end wall part 122 extends long vertically at the second end part.

For reference, FIG. 5 illustrates that the two busbars 210 and 220 are coupled to the busbar coupling device 100. Since the first side is shown in FIG. 4, the first end part of the plate 110 is disposed at the left and the second end part is disposed at the right. However, since the first side faces the back and the second side is shown in FIG. 5, the left and right are changed compared to FIG. 4 and thus the first end part of the plate 110 is disposed at the right and the second end part is disposed at the left.

The plate 110 includes a second upper wall part 142 extending in a left and right direction along the upper end of the plate 110 near the second end part. The second upper wall part 142 protrudes and extends toward the direction that the second side 112 faces in the same manner as the second end wall part 122.

The busbar coupling device 100 may further include a second edge wall part 162.

The second edge wall part 162 protrudes in the direction that the second side 112 faces and is located at the edge of the second side 112 of the plate 110. The second edge wall part 162 has one end toward the second end wall part 122 and the other end extending toward the second upper wall part 142. In more detail, one end of the second edge wall part 162 contacts the second end wall part 122 and the other end contacts the second upper wall part 142 and extends such that it is inclined toward the outside of a left and right direction as it approaches from the top to the bottom.

The busbar coupling device 100 may further include a second cover wall part 152.

The second cover wall part 152 extends spaced toward the front of the plate 110. That is, the second cover wall part 152 is spaced a predetermined distance from the second side 112 of the plate 110 in the direction that the second side 112 faces. The second cover wall part 152 may be coupled to the front ends of the second end wall part 122, the second upper wall part 142, and the second edge wall part 162.

An edge part of the second busbar 220 described later is inserted into a separated space between the plate 110 and the second cover wall part 152.

The busbar coupling device 100 may further include a second protrusion 132.

The second protrusion 132 protrudes from the second side 112 of the plate 110 in the direction that the second side 112 faces and is spaced a predetermined distance from the second end part toward the first end part. The second protrusion 132 is disposed near a lower end of the second side 112.

The second protrusion 132 is disposed closer to the first end part from the center of the left and right direction.

A busbar coupling device having the above configuration may be formed of an elastic insulating material, for example, rubber. That is, the busbar coupling device may be formed to be elastically deformed.

Hereinafter, a busbar detachable from the busbar coupling device 100 having the above structure is described.

The busbar refers to a conductor commonly connecting between a plurality of circuits and has a plate-shaped conductor formed of copper or aluminum without an insulating clad.

The busbar includes a first busbar 210 coupled to a first side 111 of the busbar coupling device 100 and a second busbar 220 coupled to a second side 112 of the busbar coupling device 100.

The first busbar 210 and the second busbar 220 may have the same structure.

The first busbar 210 includes a main body 211 extending long to the left and right, and a plurality of terminals 212, 213, and 214 extending bent in the opposite direction of the busbar coupling device 100 at a lower part of the main body 211.

When both end parts of the first bus bar 210 in the left and right length direction are referred to as a first end part and a second end part, respectively, while the first busbar 210 and the busbar coupling device 100 are coupled to each other, the first end part of the first busbar 210 is an end part at the first end part of the busbar coupling device 100 and the second end part of the first busbar 210 is an end part at the second end part of the bus coupling device 100.

A plurality of terminals in the first busbar 210 include a first terminal 212, a second terminal 213, and a third terminal 214, which are disposed spaced in a length direction. The first terminal 212 is disposed near the first end part of the first busbar 210. The second terminal 213 is disposed a predetermined distance from the first terminal 212 in the second end part direction. The third terminal 214 is disposed a predetermined distance from the second terminal 213 in the second end part direction.

A through hole penetrating vertically may be formed near an end part of each of the terminals 212, 213, and 214.

Moreover, the second busbar 220 and the first busbar 210 may have the same structure. That is, the second busbar 220 includes a main body 221, and a first terminal 222, a second terminal 223, and a third terminal 224, which are disposed to be spaced sequentially.

Hereinafter, a coupling method of the busbar coupling device 100 and the first busbar 210 having the above structure is described.

First, an upper edge at the first end part of the first busbar 210 is inserted between the first side 111 of the plate 110 and the first cover part 151. Then, while the first end part of the first busbar 210 is pressed toward the first end wall part 121 of the busbar coupling device 100, by rotating the first busbar 210 relative to the first end part, the main body 211 of the first busbar 210 is pressed toward the first side 111.

Then, although there is a slight interference between the second terminal 213 of the first busbar 210 and the first protrusion 131, if the first busbar 210 is pressed continuously as ignoring this, the first busbar 210 is coupled and fixed to the first side 111 of the busbar coupling device 100 in a forcible insertion form.

At this point, the position of the first protrusion 131 is a point contacting the side of the second terminal 213 between the second terminal 213 and the third terminal 214. Then, the first protrusion 131 becomes a lower part of the main body 211 of the first busbar 210.

Since a method and principle of coupling the second busbar 220 to the second side 122 of the busbar coupling device 100 is identical to the above-mentioned method of coupling the first busbar 210 to the first side 121 of the busbar coupling device 100, a description for a coupling method of the second busbar 220 is omitted.

As described above, when the first busbar 210 and the second busbar 220 are coupled to the busbar coupling device 100, as a plurality of busbars 210 and 220 are fixed to one busbar coupling device 100, it is possible to modularize a plurality of busbars. Additionally, only with a very simple process, an insulation between the first busbar 210 and the second busbar 220 becomes possible.

Accordingly, when the above is used for an electronic device requiring a plurality of busbars, for example, an inverter for electric vehicle, the product assembly speed may be improved and the durability and product reliability may be improved at the same time.

When the above insulating paper is installed at an electric vehicle having many vibrations, compared to a typical insulating paper, the durability may be improved and thus the stability may be also improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A busbar coupling device comprising:
   a plate including a first side and a second side disposed opposite to each other;
   a first end wall part protruding and extending in a direction that the first side faces at a first end part in a length direction of the plate;
   a first protrusion part disposed at the plate, spaced from the first end wall part, and protruding in the direction that the first side faces;

a second end wall part protruding and extending from a second end part disposed opposite to the first end part to a direction that the second side faces in the length direction of the plate; and a second protrusion part disposed at the plate, spaced from the second end wall part, and protruding in the direction that the second side faces;

a first upper wall part extending along an upper end of the plate and protruding at an upper part of the plate in the direction that the first side faces;

a first edge wall part protruding in the direction that the first side faces, one end of the first edge wall part contacting the first end wall part and the other end of the first edge wall part contacting the first upper wall part;

a first cover wall part spaced a predetermined distance from the first side of the plate such that a first space is created and protruding in the direction that the first side faces, the first cover wall part coupled to front ends of the first end wall part, the first upper wall part and the first edge wall part;

a second upper wall part extending along an upper end of the plate and protruding at an upper part of the plate in the direction that the second side faces;

a second edge wall part protruding in the direction that the second side faces, one end of the second edge wall part contacting the second end wall part and the other end of the second edge wall part contacting the second upper wall part;

a second cover wall part spaced a predetermined distance from the second side of the plate such that a second space is created and protruding in the direction that the second side faces, the second cover wall part coupled to front ends of the second end wall part, the second upper wall part and the second edge wall part;

a first busbar having a main body and a plurality of terminals, the plurality of terminals bent and extending from a lower part of the main body in the direction that the first side faces and a first edge of the first busbar inserted into the first space between the first side of the plate and the first cover part wall part such that the first protrusion becomes a lower part of the main body of the first busbar; and a second busbar having a main body and a plurality of terminals, the plurality of terminals bent and extending from a lower part of the main body in the direction that the first side faces and a second edge of the second busbar opposite to the first edge of the first busbar inserted into the second space between the second side of the plate and the second cover part wall part such that the second protrusion becomes a lower part of the main body of the second busbar.

2. A busbar coupling device assembly including a busbar coupling device to which a plurality of busbars are coupled at both sides, and a first bus bar and a second bus bar coupled to the busbar coupling device, the busbar coupling device comprising:

a plate including a first side and a second side disposed opposite to each other;

a first end wall part protruding and extending in a direction that the first side faces at a first end part in a length direction of the plate;

a first protrusion part disposed at the plate, spaced from the first end wall part, and protruding in the direction that the first side faces;

a second end wall part protruding and extending from a second end part disposed opposite to the first end part to a direction that the second side faces in the length direction of the plate;

a second protrusion part disposed at the plate, spaced from the second end wall part, and protruding in the direction that the second side faces;

a first upper wall part extending along an upper end of the plate and protruding at an upper part of the plate in the direction that the first side faces;

a first edge wall part protruding in the direction that the first side faces, one end of the first edge wall part contacting the first end wall part and the other end of the first edge wall part contacting the first upper wall part;

a first cover wall part spaced a predetermined distance from the first side of the plate such that a first space is created and protruding in the direction that the first side faces, the first cover wall part coupled to front ends of the first end wall part, the first upper wall part and the first edge wall part;

a second upper wall part extending along an upper end of the plate and protruding at an upper part of the plate in the direction that the second side faces;

a second edge wall part protruding in the direction that the second side faces, one end of the second edge wall part contacting the second end wall part and the other end of the second edge wall part contacting the second upper wall part;

a second cover wall part spaced a predetermined distance from the second side of the plate such that a second space is created and protruding in the direction that the second side faces, the second cover wall part coupled to front ends of the second end wall part, the second upper wall part and the second edge wall part, wherein the first busbar has a main body and a plurality of terminals, the plurality of terminals bent and extending from a lower part of the main body in the direction that the first side faces and a first edge of the first busbar is inserted into the first space between the first side of the plate and the first cover part wall part such that the first protrusion part becomes a lower part of the main body of the first busbar, and wherein the second busbar has a main body and a plurality of terminals, the plurality of terminals bent and extending from a lower part of the main body in the direction that the first side faces and a second edge of the second busbar opposite to the first edge of the first busbar is inserted into the second space between the second side of the plate and the second cover part wall part such that the second protrusion part becomes a lower part of the main body of the second busbar.

3. The assembly according to claim 2, wherein:

the main body of each of the first and second busbar extends long in left and right;

the plurality of terminals of each of the first and second busbar extend downward at a lower part of the corresponding main body to be spaced from each other in left and right;

a first end part of the main body and at least one of the plurality of terminals of the first busbar is disposed between the first end wall part of the busbar coupling device and the first protrusion part;

a first end part of the main body and at least one of the plurality of terminals of the second busbar is disposed between the second end wall part of the busbar coupling device and the second protrusion part;

the first end part of the main body of the first busbar contacts the first end wall part of the busbar coupling device and one of the plurality of terminals of the first busbar contacts the first protrusion part and the first end part of the main body of the second busbar contacts the first end wall part of the busbar coupling device and one of the plurality of terminals of the second busbar contacts the second protrusion part.

4. The assembly according to claim 3, wherein:

the plurality of terminals of the first busbar are disposed to be spaced from each other in a length direction and one of the plurality of the terminals contacts a side of the first protrusion part; and the plurality of terminals of the second busbar are disposed to be spaced from each other in a length direction and one of the plurality of the terminals contacts a side of the second protrusion part.

5. The assembly according to claim 2, wherein the busbar coupling device is formed of an elastically deformable material.

6. The assembly according to claim 2, wherein the plate of the busbar coupling device is formed of an insulating material.

7. The assembly according to claim 6, wherein the first end wall part and the second end wall part of the busbar coupling device are formed of an insulating material.

\* \* \* \* \*